US008686626B2

(12) United States Patent
Won et al.

(10) Patent No.: US 8,686,626 B2
(45) Date of Patent: Apr. 1, 2014

(54) OXYNITRIDE-BASED PHOSPHOR AND LIGHT EMITTING DEVICE INCLUDING THE SAME

(71) Applicants: Samsung Electronics Co., Ltd., Gyeonggi-do (KR); Industry-Academy Cooperation Corps of Sunchon National University, Jeollanam-do (KR)

(72) Inventors: Hyong Sik Won, Gyeonggi-do (KR); Kee Sun Sohn, Jeollanam-do (KR); Un Bae Park, Jeollanam-do (KR)

(73) Assignees: Samsung Electronics Co., Ltd., Suwon-Si (KR); Industry-Academy Cooperation Corps of Sunchon National University, Jeollanam-do (KR)

( * ) Notice: Subject to any disclaimer, the term of this patent is extended or adjusted under 35 U.S.C. 154(b) by 0 days.

(21) Appl. No.: 13/708,319

(22) Filed: Dec. 7, 2012

(65) Prior Publication Data

US 2013/0147342 A1 Jun. 13, 2013

(30) Foreign Application Priority Data

Dec. 7, 2011 (KR) .......................... 10-2011-0130256

(51) Int. Cl.
*H01J 1/62* (2006.01)

(52) U.S. Cl.
USPC ............................. 313/503; 428/690; 313/512

(58) Field of Classification Search
USPC .................................... 313/503, 512; 428/690
See application file for complete search history.

(56) References Cited

U.S. PATENT DOCUMENTS

| 8,057,704 | B2 * | 11/2011 | Xie et al. ................ 252/301.4 R |
| 8,206,611 | B2 * | 6/2012 | Hirosaki et al. ......... 252/301.4 F |
| 2007/0159066 | A1 | 7/2007 | Cheetham et al. |
| 2009/0121608 | A1 * | 5/2009 | Xie et al. ........................ 313/364 |
| 2010/0001303 | A1 | 1/2010 | Schmidt et al. |

* cited by examiner

*Primary Examiner* — Mary Ellen Bowman
(74) *Attorney, Agent, or Firm* — McDermott Will & Emery LLP

(57) ABSTRACT

There are provided an oxynitride-based phosphor and a light emitting device including the same. The oxynitride-based phosphor has a rare-earth element dissolved in a host material represented by a general formula: $Ca_{15}Si_{20}O_{10}N_{30}$. The rare-earth element is at least one selected from a group consisting of manganese (Mn), cerium (Ce), praseodymium (Pr), neodymium (Nd), samarium (Sm), europium (Eu), gadolinium (Gd), dysprosium (Dy), terbium (Tb), holmium (Ho), erbium (Er), thulium (Tm) and ytterbium (Yb). The host material has a crystal lattice according to a peak of an X-ray powder diffraction pattern, and the crystal lattice has a cubic crystal structure.

20 Claims, 11 Drawing Sheets

| Lable | Site | x | y | z | B | Occ |
|---|---|---|---|---|---|---|
| Ca1 | 24d | 0.1044(2) | 0.1591(2) | 0.3742(2) | 0.18(6) | 1 |
| Ca2 | 24d | 0.1110(2) | 0.3917(2) | 0.3400(2) | 1.09(6) | 1 |
| Ca3 | 4a | 0.0000(0) | 0.0000(0) | 0.0000(0) | 0.8(6) | 0.167 |
| Ca4 | 4b | 0.5000(0) | 0.5000(0) | 0.5000(0) | 1.4(2) | 0.167 |
| Ca5 | 4c | 0.2824(4) | 0.2824(4) | 0.2824(4) | 1.4(4) | 0.167 |
| Si1 | 24d | 0.0201(2) | 0.2624(3) | 0.2120(2) | 0.48(8) | 1 |
| Si2 | 24d | 0.0355(3) | 0.0818(3) | 0.1930(3) | 0.5(1) | 1 |
| Si3 | 24d | 0.3131(3) | 0.4618(3) | 0.4337(2) | 0.08(9) | 1 |
| Si4 | 8c | 0.1979(3) | 0.1979(3) | 0.1979(3) | 1.2(2) | 0.333 |
| O1 | 24d | 0.0475(6) | 0.0476(6) | 0.1555(7) | 0.3(2) | 0.833 |
| N1 | 24d | 0.0475(6) | 0.0476(6) | 0.1555(7) | 0.3(2) | 0.167 |
| O2 | 24d | 0.0162(7) | 0.3538(7) | 0.4613(7) | 1.1(2) | 0.833 |
| N2 | 24d | 0.0162(7) | 0.3538(7) | 0.4613(7) | 1.1(2) | 0.167 |
| N3 | 24d | 0.0120(9) | 0.2715(8) | 0.1010(8) | 1.6(2) | 1 |
| N4 | 24d | 0.1285(7) | 0.2725(6) | 0.2438(7) | 0.5(2) | 1 |
| N5 | 24d | 0.1564(7) | 0.2571(7) | 0.4871(7) | 1.1(3) | 1 |
| N6 | 24d | 0.2431(8) | 0.4696(7) | 0.3431(8) | 0.7(2) | 1 |
| N7 | 8c | 0.1171(7) | 0.1171(7) | 0.1171(7) | 0.8(3) | 0.333 |
| N8 | 8c | 0.4118(7) | 0.4118(7) | 0.4118(7) | 0.6(4) | 0.333 |

FIG. 10

OXYNITRIDE-BASED PHOSPHOR AND LIGHT EMITTING DEVICE INCLUDING THE SAME

CROSS-REFERENCE TO RELATED APPLICATIONS

This application claims priority to Korean Patent Application No. 10-2011-0130256 filed on Dec. 7, 2011, in the Korean Intellectual Property Office, the disclosure of which is incorporated herein by reference.

TECHNICAL FIELD

The present application relates to an oxynitride-based phosphor having a novel crystal structure and a light emitting device including the same.

BACKGROUND

In general, a white light emitting diode (LED) recently prominent due to its use in lighting devices, LCD backlights, automobile lighting devices, and the like, includes an LED emitting blue or near ultraviolet light and, as an excitation source, a phosphor for converting a wavelength of the light emitted from the LED into visible light.

A representative method of implementing the white LED includes employing a blue LED formed of an InGaN-based material having a wavelength of 450 to 550 nm as a light emitting element and employing a YAG-based phosphor emitting yellow light and represented by a compositional formula of $(Y, Gd)_3(Al, Ga)_5O_{12}$ as a phosphor. In the white LED, blue light emitted from the light emitting element is incident on a phosphor layer and repeatedly absorbed and scattered within the phosphor layer. Yellow light formed by wavelength converted blue light and a portion of the incident blue light are mixed, such that the blue light absorbed in the phosphor through the repeated process may appear to the human eye as white light.

However, the white LED having such a structure has few red light components in light thereof, a high color temperature, and insufficient green light components, and thus, merely functions as illumination light having low color rendering properties.

In addition, oxide-based phosphors generally tend to be degraded in terms of luminous intensity when a wavelength of an excitation source is above 400 nm, and accordingly, are not appropriate for implementing white light having high brightness using blue light.

Therefore, oxynitride-based phosphors having excellent luminous efficiency in the case in which a wavelength of an excitation source is above 400 nm, while having stability equal to or greater than that of oxide-based phosphors, have recently been receiving attention in white LED application fields. The oxynitride-based phosphors are materials originally developed as engineering ceramics and thus, have a low reduction in efficiency and low levels of color change due to moisture or heat.

However, research into oxynitride-based phosphors present in a compositional area outside of α-type or β-type sialon (Si—Al—O—N) phosphors, has not been greatly undertaken or is little known.

SUMMARY

An aspect of the present application provides an oxynitride-based phosphor having excellent structural stability, in particular, having excellent luminescent brightness in a red light wavelength band and a novel crystal structure facilitating improvements in luminescent brightness to thereby be appropriately used in LED fields of application.

Another aspect of the present application also provides a light emitting device including the oxynitride-based phosphor.

According to an aspect of the present application, there is provided an oxynitride-based phosphor having a rare-earth element dissolved in a host material represented by a general formula: $Ca_{15}Si_{20}O_{10}N_{30}$. The rare-earth element is at least one selected from a group consisting of manganese (Mn), cerium (Ce) praseodymium (Pr), neodymium (Nd), samarium (Sm), europium (Eu), gadolinium (Gd), dysprosium (Dy), terbium (Tb), holmium (Ho), erbium (Er), thulium (Tm) and ytterbium (Yb). The host material has a crystal lattice according to a peak of an X-ray powder diffraction pattern, wherein the crystal lattice has a cubic crystal structure.

When the rare-earth element is denoted as Re, the oxynitride-based phosphor may be represented by a general formula: $(Ca_{1-x})_{15}Si_{20}O_{10}N_{30}:Re_x$ $(0.0001<x<0.2)$.

In the cubic crystal structure of the host material, a lattice constant $a=15.48978$ Å and a rate of change of the lattice constant a may be 10% or less.

The rare-earth element may be $Eu^{2+}$.

A space group of the cubic crystal structure may be Pa-3.

The oxynitride-based phosphor may exhibit a light emitting peak wavelength of 600 to 660 nm with respect to excitation light having a peak wavelength range of 250 to 550 nm.

The oxynitride-based phosphor may have an average particle size of 1 to 20 μm.

According to another aspect of the present application, there is provided a light emitting device including a light emitting element for emitting excitation light A wavelength converting unit absorbs the excitation light and emits visible light The wavelength converting unit may include an oxynitride-based phosphor having a rare-earth element dissolved in a host material represented by a general formula: $Ca_{15}Si_{20}O_{10}N_{30}$. The rare-earth element is at least one selected from a group consisting of manganese (Mn), cerium (Ce), praseodymium (Pr), neodymium (Nd), samarium (Sm), europium (Eu) gadolinium (Gd), dysprosium (Dy), terbium (Tb), holmium (Ho), erbium (Er), thulium (Tm) and ytterbium (Yb) The host material has a crystal lattice according to a peak of an X-ray powder diffraction pattern, wherein the crystal lattice has a cubic crystal structure.

The light emitting device may be an ultraviolet light emitting diode or blue light emitting diode.

In another aspect of the present application, a method of preparing an oxynitride-based phosphor is provided. The method comprises mixing a rare-earth oxide with a host material having a general formula: $Ca_{15}Si_{20}O_{10}N_{30}$ to form a mixture. The mixture is fired under a gas atmosphere at a temperature of about 1400 to 1600° C. The rare-earth element is at least one selected from a group consisting of manganese (Mn), cerium (Ce), praseodymium (Pr), neodymium (Nd), samarium (Sm), europium (Eu) gadolinium (Gd), dysprosium (Dy), terbium (Tb), holmium (Ho), erbium (Er), thulium (Tm) and ytterbium (Yb). The host material has a crystal lattice according to a peak of an X-ray powder diffraction pattern. The crystal lattice has a cubic crystal structure.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The above and other aspects, features and other advantages of the present application will be more clearly understood from the following detailed description taken in conjunction with the accompanying drawings, in which:

FIG. 10 is a diagram illustrating crystal structure analysis results obtained by using the Rietveld method.

DETAILED DESCRIPTION

Figure 1:
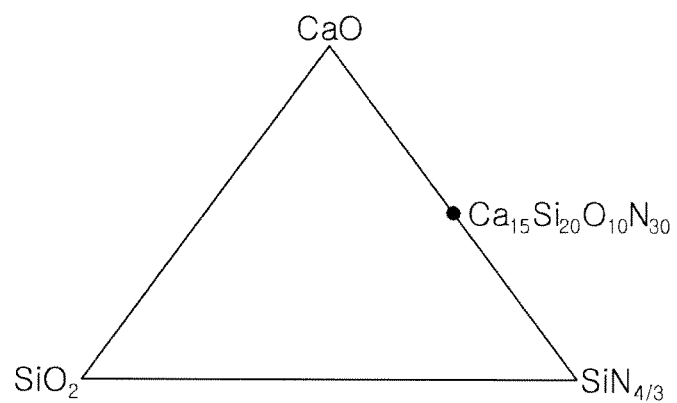
FIG. 1 is a ternary compositional diagram schematically illustrating an oxynitride-based phosphor according to an embodiment of the present application.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

Hereinafter, examples of the present application will be described in detail with reference to the accompanying drawings. The application may, however, be exemplified in many different forms and should not be construed as being limited to the specific examples set forth herein. Rather, these examples are provided so that this disclosure will be thorough and complete, and will fully convey the scope of the application to those skilled in the art. In the drawings, the shapes and dimensions of elements may be exaggerated for clarity, and the same reference numerals will be used throughout to designate the same or like elements.

An oxynitride-based phosphor according to an examples of the present application has a rare-earth element dissolved in a host material represented by a general formula: $Ca_{15}Si_{20}O_{10}N_{30}$ The rare-earth element is at least one from a group consisting of manganese (Mn), cerium (Ce), praseodymium (Pr), neodymium (Nd), samarium (Sm), europium (Eu), gadolinium (Gd), dysprosium (Dy), terbium (Tb), holmium (Ho), erbium (Er), thulium (Tm) and ytterbium (Yb) The host material has a crystal lattice according to a peak of an X-ray powder diffraction pattern, wherein the crystal lattice has a cubic crystal structure. In particular, when the rare-earth element is denoted as Re, the oxynitride-based phosphor may be represented by a general formula: $(Ca_{1-x})_{15}Si_{20}O_{10}N_{30}:Re_x$ (0.0001<x<0.2). The compositional formula of the phosphor according to the embodiment of the present application may be illustrated in the ternary compositional diagram of FIG. 1.

More specifically describing the host material, lattice constants a=15.48978 Å and, $\alpha=\gamma=\beta=90°$ are satisfied in the cubic crystal structure. In addition, it is confirmed that a space group of the cubic crystal structure corresponds to Pa-3. In this case, when rates of change of the lattice constant a and the space group are 10% or less, respectively, it can be considered that the same composition is used.

The oxynitride-based phosphor having the above-mentioned structure has a novel crystal structure, unknown in the related art. In particular, in the case in which Eu or the like is dissolved as a lighting metal element, when ultraviolet light or visible light is irradiated thereonto as an excitation source, the oxynitride-based phosphor has excellent efficiency in wavelength bands ranging from a green wavelength band to a red wavelength band, in particular, a wavelength range of approximately 600~660 nm. The oxynitride-based phosphor served as a wavelength converting unit to thereby be appropriately used as a phosphor for a light emitting element such as a light emitting diode or the like. By using the light emitting element and a phosphor composition, a light emitting device, in particular, a light emitting device capable of emitting white light, may be implemented. A detailed description of a novel crystal structure of the oxynitride-based phosphor will be described below.

According to experimentation undertaken by the inventor(s), in the case of outside of the compositional conditions, the crystal structure is varied, rather than being a cubic crystal structure, such that intended characteristics of the phosphor may not be obtained. However, satisfying the compositional conditions is not necessarily required to obtain the cubic crystal structure, and if the cubic crystal structure is obtained, even in the case of being outside of the compositional conditions, it can be appreciated that they are included within the scope of the present application.

Meanwhile, the phosphor having the above-mentioned structure may be made of oxynitride and thus, has excellent structural stability, such that the phosphor has improved stability in environments including an oxidation atmosphere or a moist environment.

In certain examples, a phosphor composition having the compositional formula is configured in a single phase, but may include an amorphous crystal phase inevitably generated in an imperceptible amount during a manufacturing process, or other crystal phases rather than a cubic crystal phase. The phosphor composition may include a compound including the amorphous crystal phase or other crystal phases, as long as characteristics thereof are not affected thereby.

Meanwhile, an average particle size of the phosphor according to the embodiment of the present application may be in the range of 1 to 20 μm. This is because when the average particle size is smaller than 1 μm, a light absorbing rate may be degraded due to scattering and uniform dispersion to a resin material enclosing an LED may not be facilitated, while when the average particle size is greater than 20 μm, irregularity of luminous intensity and color may occur.

Hereinafter, a method of manufacturing the oxynitride-based phosphor having the above-mentioned structure may be described by way of an example.

As for raw materials for manufacturing the phosphor, silicon nitride ($Si_3N_4$) powder, calcium oxide (CaO) powder, and europium oxide ($Eu_2O_3$) powder were used as main components, Ca, Si, and Eu. The raw materials such as CaO, $\alpha$-$Si_3N_4$, and $Eu_2O_3$ were weighed and mixed in order to have a predetermined composition, and in this case, the amount of mixture per sample was 1 g. The mixing operation of the raw materials was manually undertaken for 10 minutes in an ambient atmosphere.

The mixture samples obtained as above were fired under a nitrogen gas atmosphere in which nitrogen gas having a higher pressure than atmospheric pressure and a lower pressure than an air pressure of 20 atm, as a main component and $H_2$ gas of 0~25% were provided. When firing is performed under the nitrogen gas atmosphere as above, decomposition of a nitride synthesized during high temperature firing may be prevented or inhibited, and a compositional deviation in the produced nitride may be reduced to enable the fabrication of a phosphor composition having excellent performance. Meanwhile, the fact that nitrogen gas is provided as a main component means that nitrogen gas is included in the amount of 75% or higher of the overall gas. In addition, a firing temperature may be about 1400~1600° C. In addition, a firing time may be provided within a range of about 30 minutes to 100 hours, but in other examples, may be 2 hours to 12 hours in consideration of quality and productivity. In this example, firing was undertaken at a firing temperature of about 1525° C. for approximately 8 hours, under atmospheric pressure, and an ultrapure nitrogen (99.999%) gas atmosphere A crushing operation was performed thereon to fabricate a phosphor.

Figure 2:
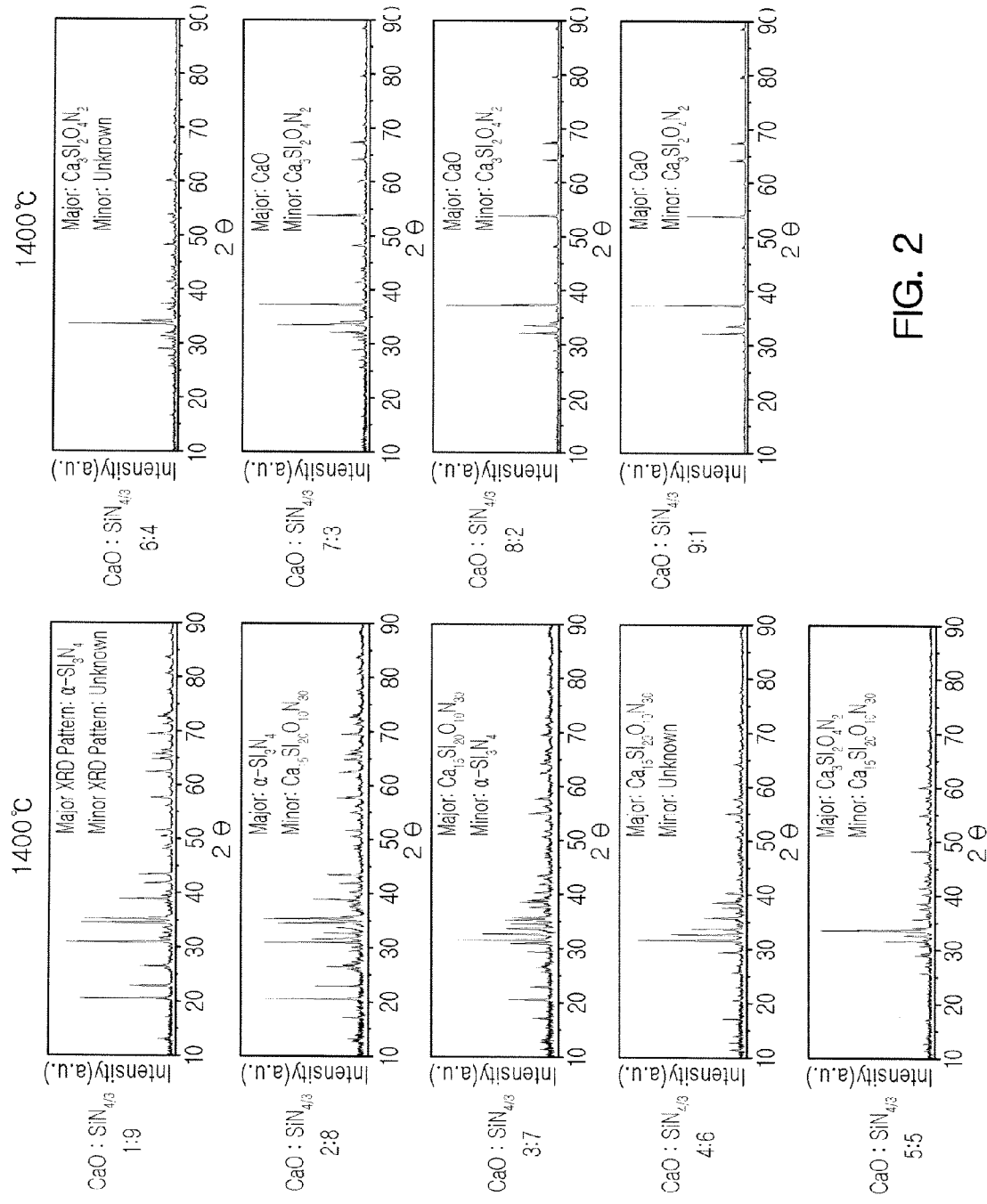
FIGS. 2 through 4 are diagrams illustrating XRD patterns in which crystal structures of materials obtained depending on firing temperatures while varying a ratio of CaO and $SiN_{4/3}$ provided as raw materials are analyzed.
Figure 3:
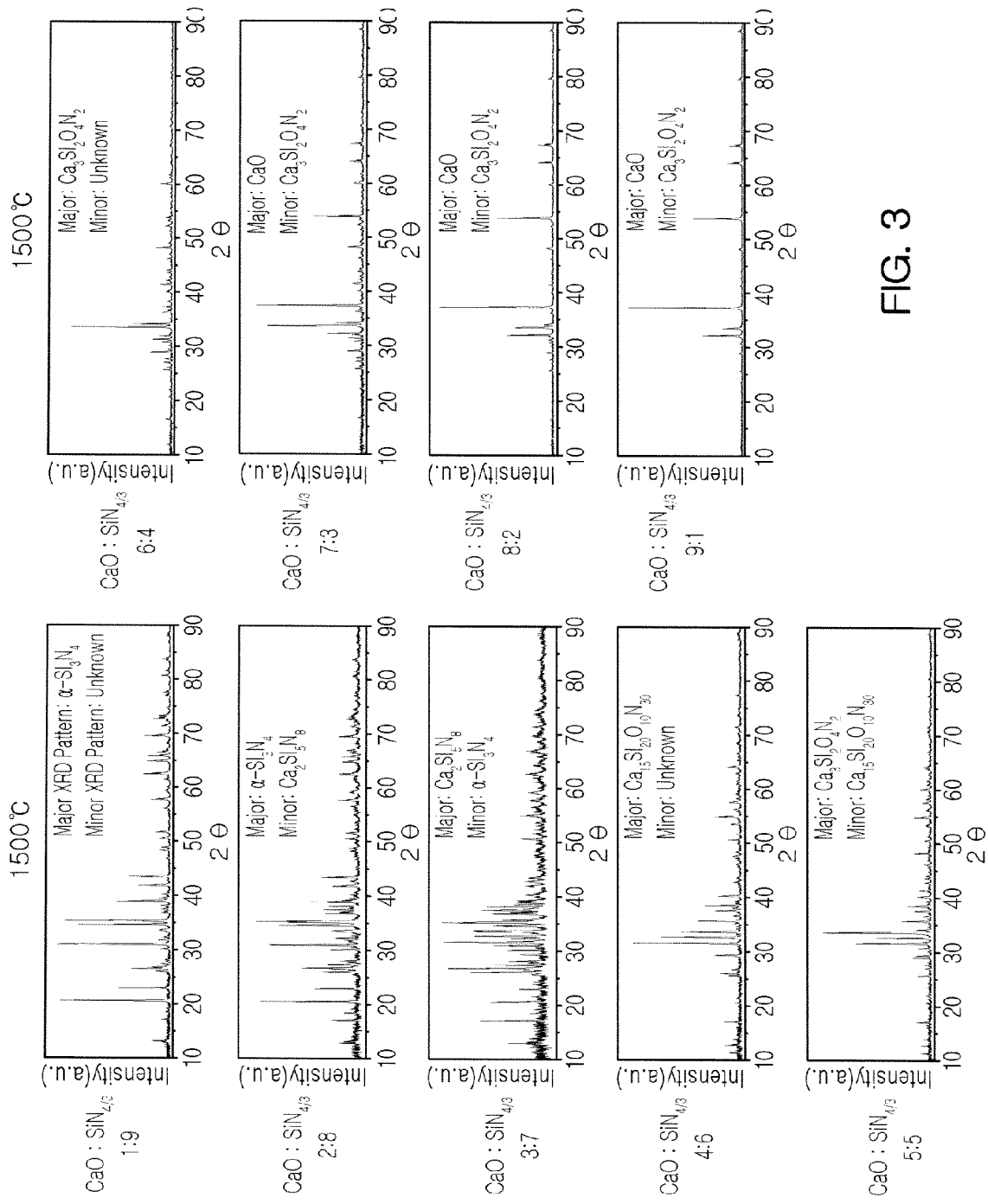
Figure 4:
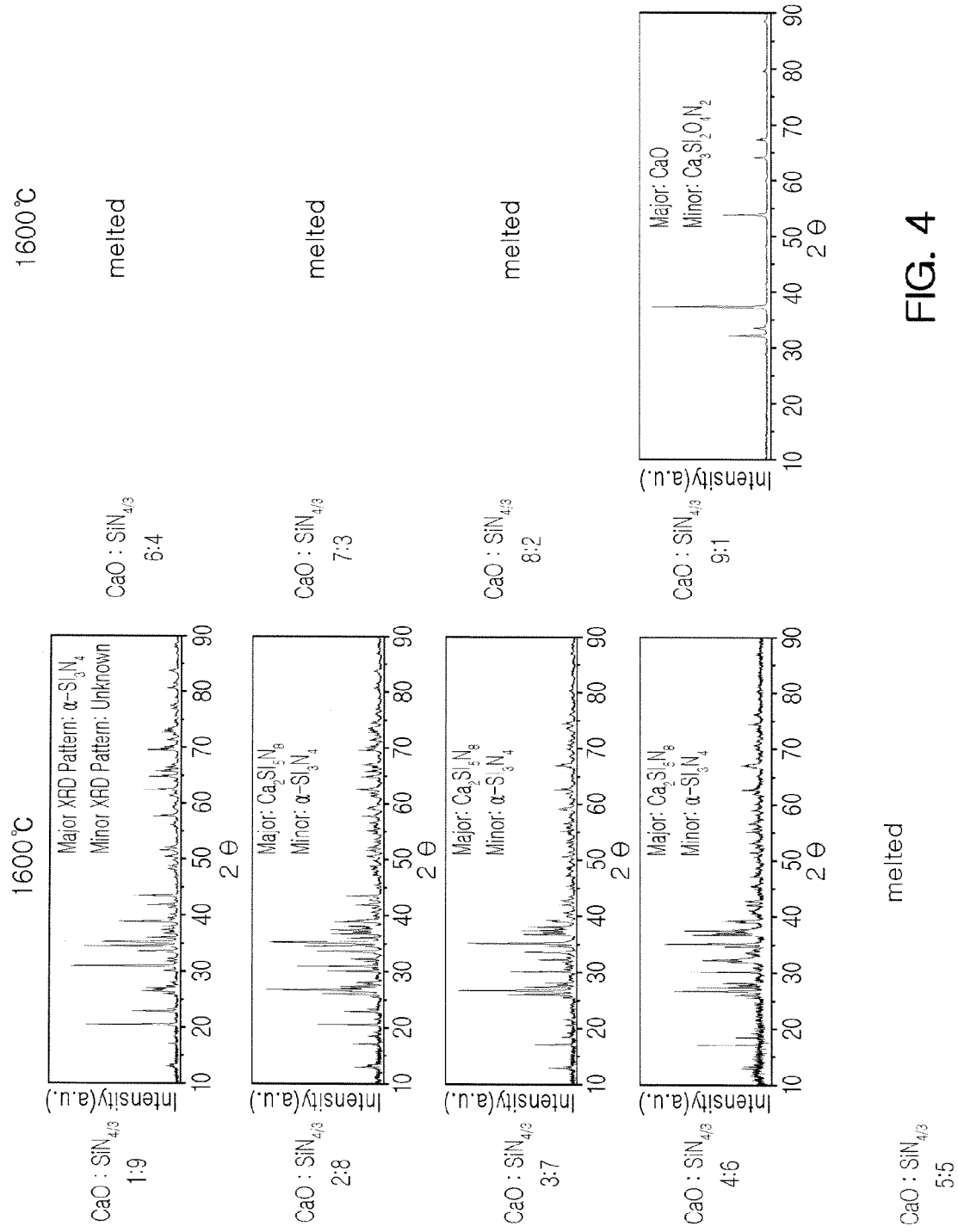
Figure 5:
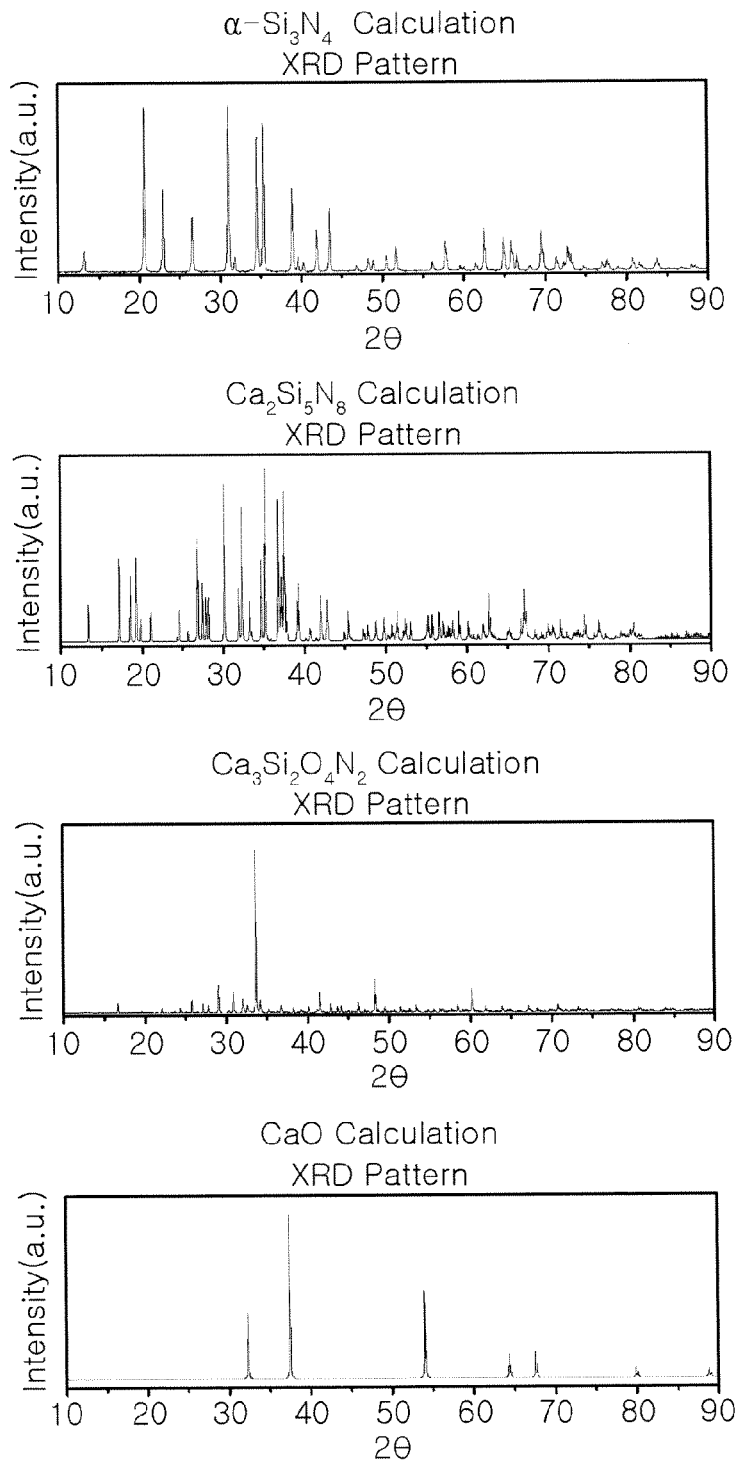
FIG. 5 is a diagram illustrating XRD patterns of four types of crystal structures known in the related art, in order to be compared with the XRD patterns of FIGS. 2 through 4.

The inventor(s) of the present application confirmed that the phosphor having the compositional formula according to the embodiment of the present application was practically synthesized by adjusting a mixing ratio of the raw materials and a firing temperature therefor, using the above-mentioned fabrication process. With regard to this, a detailed description will be provided with reference to XRD pattern analysis results of FIGS. 2 through 7. FIGS. 2 through 4 illustrate XRD patterns in which crystal structures of materials obtained depending on firing temperatures while varying a ratio of CaO and $SiN_{4/3}$ provided as raw materials are analyzed. FIG. 5 illustrates XRD patterns of four types of crystal structures known in the related art, in order to be compared with the XRD patterns of FIGS. 2 through 4. Referring to FIGS. 2 to 4, a $Ca_{15}Si_{20}O_{10}N_{30}$ crystal was obtained under the condition in which a ratio of CaO and $SiN_{4/3}$ was within a range of 3:7 to 5:5 and a firing temperature was about 1400° C. to 1500° C.

Figure 6:
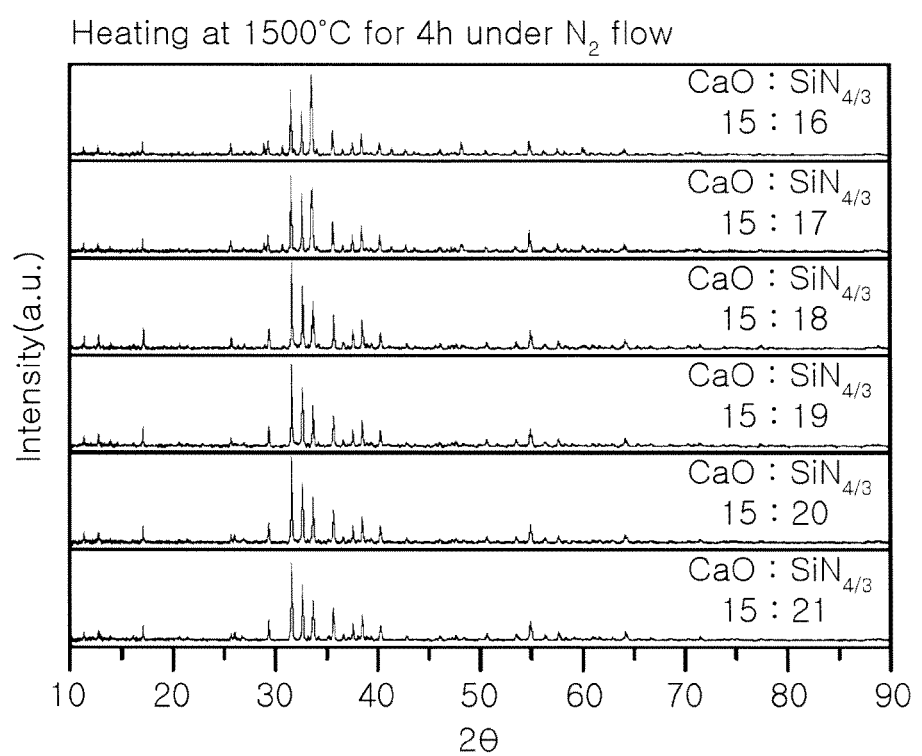
FIGS. 6 and 7 are diagrams illustrating XRD patterns of compositions obtained by precisely adjusting a ratio of CaO and $SiN_{4/3}$, depending on firing temperatures of 1500° C. and 1600° C., respectively.
Figure 7:
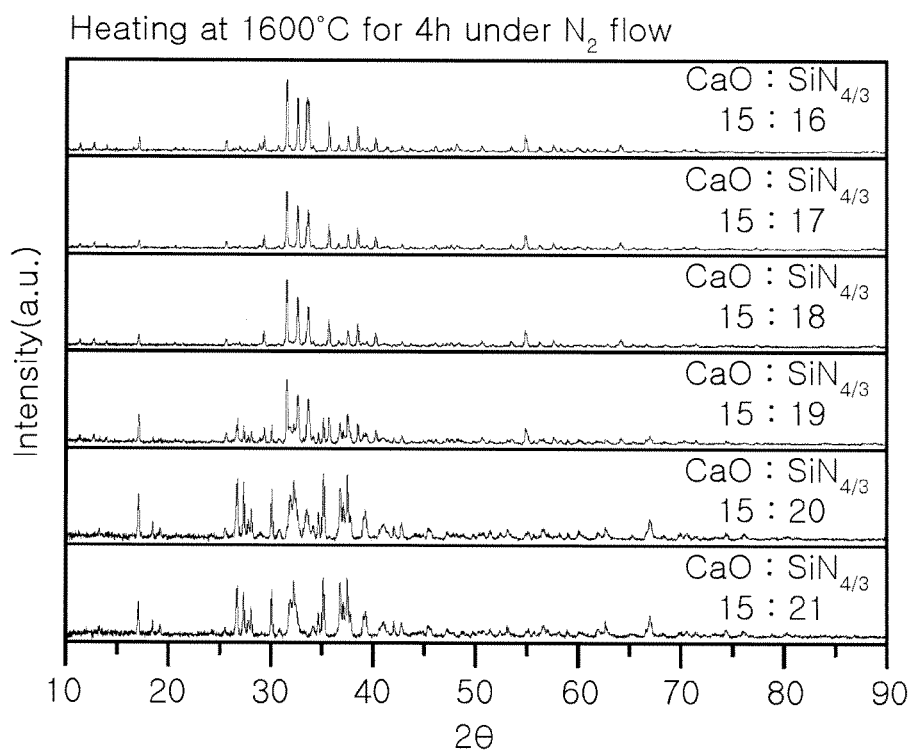

FIGS. 6 and 7 illustrate XRD patterns of compositions obtained by precisely adjusting a ratio of CaO and $SiN_{4/3}$, depending on firing temperatures of about 1500° C. and 1600° C., respectively. In the case of a firing temperature of about 1400° C., similar results to the case of a firing temperature of 1500° C. were shown. In FIGS. 6 and 7, when a ratio of CaO and $SiN_{4/3}$ was changed to 15:16~15:21 at a firing temperature of 1500° C., it is confirmed that a $Ca_{15}Si_{20}O_{10}N_{30}$ crystal was obtained. Unlike this, it was difficult to synthesize the $Ca_{15}Si_{20}O_{10}N_{30}$ crystal at a firing temperature of 1600° C.

Based on the XRD pattern analysis results, phosphor compositions having different contents of activator (Eu) were fabricated as described in the following Examples.

Example 1

As raw powder materials for a phosphor composition according to Example 1, 0.4641 g of CaO, 0.5212 g of $\alpha$-$Si_3N_4$, and 0.0147 g of $Eu_2O_3$ were respectively weighed and then manually mixed using a mortar under an ambient atmosphere to obtain 1 g of raw powder mixture. The 1 g of the raw powder mixture was inserted into a crucible, nitrogen gas was provided to the interior of a firing furnace in an amount of 500 cc per minute. A firing treatment through heating undertaken at about 1525° C. was performed for about 8 hours, and then, a crushing operation was carried out thereon to obtain a phosphor composition. When the phosphor composition was excited by a light source of 460 nm, it was confirmed that a central light emitting peak thereof was approximately 609 nm.

Example 2

As raw powder materials for a phosphor composition according to Example 2, 0.4548 g of CaO, 0.5160 g of $\alpha$-$Si_3N_4$, and 0.0291 g of $Eu_2O_3$ were respectively weighed and then manually mixed using a mortar under an ambient atmosphere to obtain 1 g of a raw powder mixture. The 1 g of the raw powder mixture was inserted into a crucible, nitrogen gas was provided to the interior of a firing furnace in an amount of 500 cc per minute. A firing treatment through heating undertaken at about 1525° C. was performed for about 8 hours, and then, a crushing operation was carried out thereon to obtain a phosphor composition. When the phosphor composition was excited by a light source of 460 nm, it was confirmed that a central light emitting peak thereof was approximately 630 nm.

Example 3

As raw powder materials for a phosphor composition according to Example 3, 0.4458 g of CaO, 0.5110 g of $\alpha$-$Si_3N_4$, and 0.0433 g of $Eu_2O_3$ were respectively weighed and then manually mixed using a mortar under an ambient atmosphere to obtain 1 g of a raw powder mixture. The 1 g of the raw powder mixture was inserted into a crucible, nitrogen gas was provided to the interior of a firing furnace in an amount of 500 cc per minute. A firing treatment through heating undertaken at about 1525° C. was performed for about 8 hours, and then, a crushing operation was carried out thereon to obtain a phosphor composition. When the phosphor composition was excited by a light source of 460 nm, it was confirmed that a central light emitting peak thereof was approximately 641 nm.

Example 4

As raw powder materials for a phosphor composition according to Example 4, 0.4369 g of CaO, 0.5060 g of $\alpha$-$Si_3N_4$, and 0.0571 g of $Eu_2O_3$ were respectively weighed and then manually mixed using a mortar under an ambient atmosphere to obtain 1 g of a raw powder mixture. The 1 g of the raw powder mixture was inserted into a crucible, nitrogen gas was provided to the interior of a firing furnace in an amount of 500 cc per minute. A firing treatment through heating undertaken at about 1525° C. was performed for about 8 hours, and then, a crushing operation was carried out thereon to obtain a phosphor composition. When the phosphor composition was excited by a light source of 460 nm, it was confirmed that a central light emitting peak thereof was approximately 641 nm.

Example 5

As raw powder materials for a phosphor composition according to Example 5, 0.4282 g of CaO, 0.5011 g of α-Si$_3$N$_4$, and 0.0707 g of Eu$_2$O$_3$ were respectively weighed and then manually mixed using a mortar under an ambient atmosphere to obtain 1 g of a raw powder mixture. The 1 g of the raw powder mixture was inserted into a crucible, nitrogen gas was provided to the interior of a firing furnace in an amount of 500 cc per minute. A firing treatment through heating undertaken at about 1525° C. was performed for about 8 hours, and then, a crushing operation was carried out thereon to obtain a phosphor composition. When the phosphor composition was excited by a light source of 460 nm, it was confirmed that a central light emitting peak thereof was approximately 648 nm.

Example 6

As raw powder materials for a phosphor composition according to Example 6, 0.4196 g of CaO, 0.4963 g of α-Si$_3$N$_4$, and 0.0840 g of Eu$_2$O$_3$ were respectively weighed and then manually mixed using a mortar under an ambient atmosphere to obtain 1 g of a raw powder mixture. The 1 g of the raw powder mixture was inserted into a crucible, nitrogen gas was provided to the interior of a firing furnace in an amount of 500 cc per minute, a firing treatment through heating undertaken at about 1525° C. was performed for about 8 hours, and then, a crushing operation was carried out thereon to obtain a phosphor composition. When the phosphor composition was excited by a light source of 460 nm, it was confirmed that central light emitting peak thereof was approximately 655 nm.

Example 7

As raw powder materials for a phosphor composition according to Example 7, 0.4112 g of CaO, 0.4916 g of α-Si$_3$N$_4$, and 0.0971 g of Eu$_2$O$_3$ were respectively weighed and then manually mixed using a mortar under an ambient atmosphere to obtain 1 g of a raw powder mixture. The 1 g of the raw powder mixture was inserted into a crucible, nitrogen gas was provided to the interior of a firing furnace in an amount of 500 cc per minute. A firing treatment through heating undertaken at about 1525° C. was performed for about 8 hours, and then, a crushing operation was carried out thereon to obtain a phosphor composition. When the phosphor composition was excited by a light source of 460 nm, it was confirmed that a central light emitting peak thereof was approximately 654 nm.

Example 8

As raw powder materials for a phosphor composition according to Example 8, 0.4030 g of CaO, 0.4870 g of α-Si$_3$N$_4$, and 0.1100 g of Eu$_2$O$_3$ were respectively weighed and then manually mixed using a mortar under an ambient atmosphere to obtain 1 g of a raw powder mixture. The 1 g of the raw powder mixture was inserted into a crucible, nitrogen gas was provided to the interior of a firing furnace in an amount of 500 cc per minute. A firing treatment through heating undertaken at about 1525° C. was performed for about 8 hours, and then, a crushing operation was carried out thereon to obtain a phosphor composition. When the phosphor composition was excited by a light source of 460 nm, it was confirmed that a central light emitting peak thereof was approximately 655 nm.

Example 9

As raw powder materials for a phosphor composition according to Example 9, 0.3949 g of CaO, 0.4825 g of α-Si$_3$N$_4$, 0.1226 g of Eu$_2$O$_3$ were respectively weighed and then manually mixed using a mortar under an ambient atmosphere to obtain 1 g of a raw powder mixture. The 1 g of the raw powder mixture was inserted into a crucible, nitrogen gas was provided to the interior of a firing furnace in an amount of 500 cc per minute. A firing treatment through heating undertaken at about 1525° C. was performed for about 8 hours, and then, a crushing operation was carried out thereon to obtain a phosphor composition. When the phosphor composition was excited by a light source of 460 nm, it was confirmed that a central light emitting peak thereof was approximately 660 nm.

Mixing ratios of the raw materials according to Examples 1 to 9 and consequent luminescent properties thereof were arranged in Table 1 below. In this case, values of peak wavelengths were approximately deduced.

TABLE 1

| Example | Mixing Ratios of Raw Materials | | | Peak Wavelength (μm) |
| --- | --- | --- | --- | --- |
| | CaO | Si$_3$N$_4$ | Eu$_2$O$_3$(Molar ratio) | |
| 1 | 0.4641 | 0.5212 | 0.0147(0.01%) | 609 |
| 2 | 0.4548 | 0.5160 | 0.0291(0.02%) | 630 |
| 3 | 0.4458 | 0.5110 | 0.0433(0.03%) | 641 |
| 4 | 0.4369 | 0.5060 | 0.0571(0.04%) | 641 |
| 5 | 0.4282 | 0.5011 | 0.0707(0.05%) | 648 |
| 6 | 0.4196 | 0.4963 | 0.0840(0.06%) | 655 |
| 7 | 0.4121 | 0.4916 | 0.0971(0.07%) | 654 |
| 8 | 0.4030 | 0.4870 | 0.1100(0.08%) | 655 |
| 9 | 0.3949 | 0.4825 | 0.1226(0.09%) | 660 |

Figure 8:
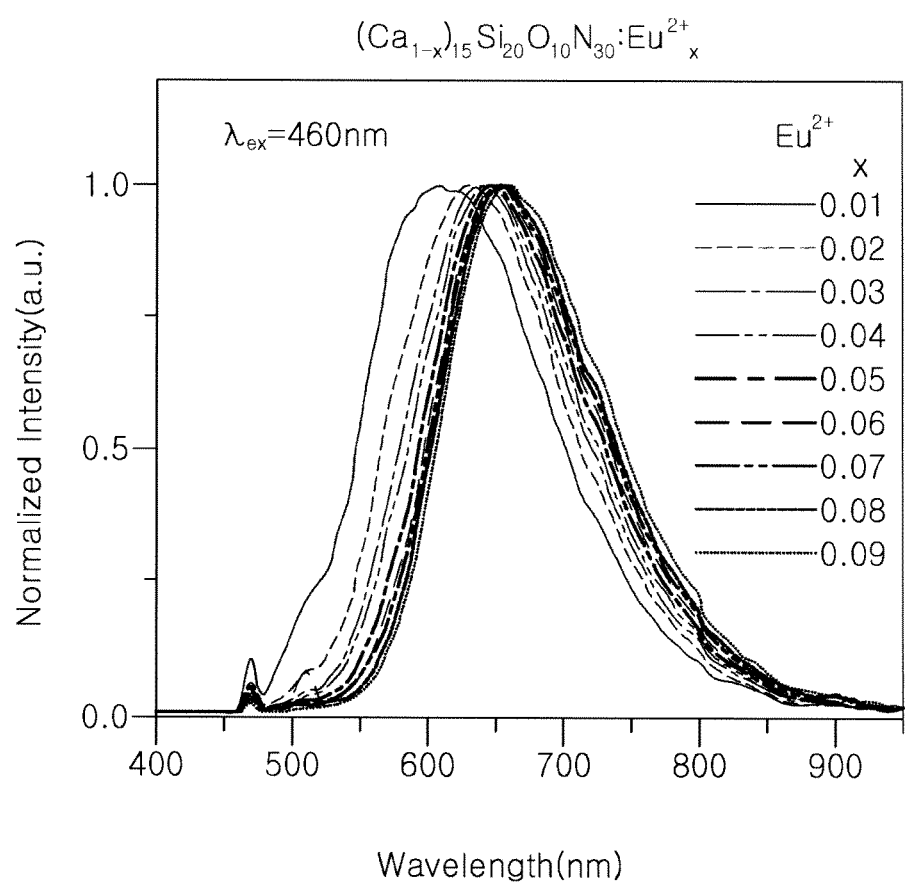
FIG. 8 is a diagram illustrating photoluminescence (PL) characteristics of phosphors according to Examples 1 to 9 of the present application.
Figure 9:
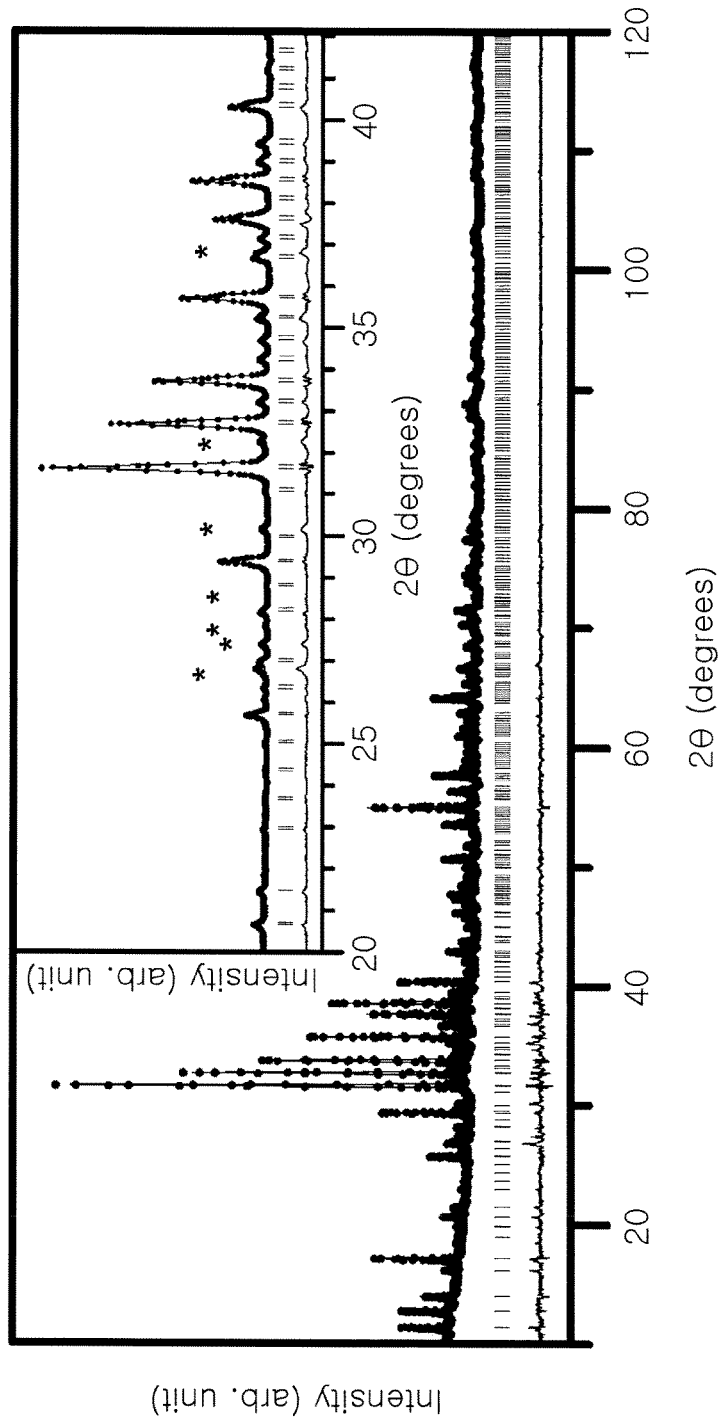
FIG. 9 is a diagram illustrating crystal structure analysis results of the phosphor according to the Examples of the present application, using X-Ray Diffraction (XRD) after the phosphor is manufactured.

As shown in FIG. 8, luminescent properties of the phosphor compositions fabricated as above were analyzed by using a photoluminescence (PL) device, and brightness and variance in center wavelength depending on the concentration of Eu$^2$ were shown. As illustrated in the graph of FIG. 8, a peak wavelength increased in accordance with an increase in the amount of Eu. FIG. 9 is a diagram illustrating crystal structure analysis results of the phosphor according to the Examples of the present application, using X-Ray Diffraction (XRD) after the phosphor is fabricated. In order to precisely analyze a crystal structure, profile matching was performed on the phosphor compositions selected after the XRD analysis. In this case, the phosphor composition used in the analysis is $(Ca_{1-x})_{15}Si_{20}O_{10}N_{30}$:Eu$_x$ (x=0.04). Further, a crystal structure of a phosphor sample having the composition was analyzed by using the Rietveld method.

The Rietveld method is a method of comparing a practically measured diffraction intensity of an X-ray obtained through practical measurement and a diffraction intensity of an X-ray obtained through theoretical calculation from a crystal structure model configured by predicting a crystal structure, and refining various structural parameters of the latter model by using the least squares method so as to reduce a difference between both intensities, thereby inducing an accurate crystal structural model.

Figure 11:
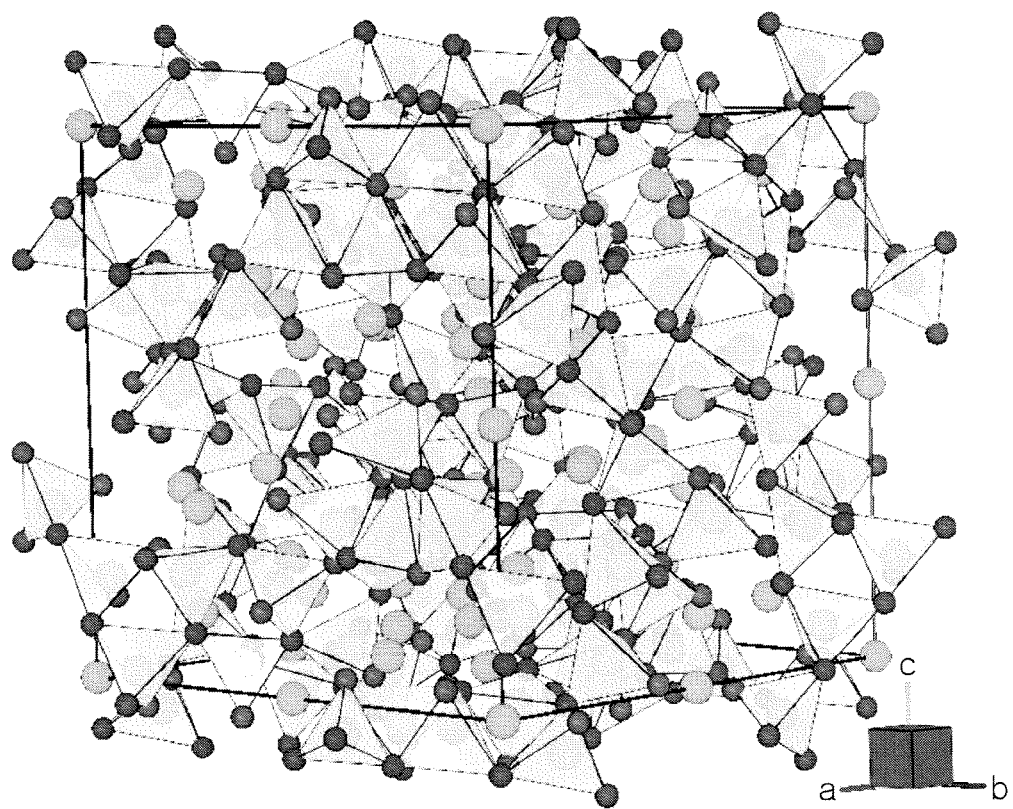
FIG. 11 is a diagram schematically illustrating a crystal structure of the phosphor according to an example of the present application.

The analysis results according to the Rietveld method were shown in FIG. 10 and accurate atomic positions of the phosphor composition may be understood through the analysis results. As a result, a crystal structure of the phosphor composition is shown in FIG. 11 and Table 2, and in this case, blue color refers to a nitrogen atom, red color refers to an oxygen atom, green color refers to a calcium (Ca) atom, and an atom present within a quadrangular pyramid refers to a silicon (Si) atom. In this case, differences may be generated according to the Examples, but as described above, as long as the differences are generated within a ratio of change of approximately 10%, it may be considered that the same compositions are used.

TABLE 2

| Composition | $Ca_{15}Si_{20}O_{10}N_{30}$ |
|---|---|
| Space Group | Pa-3 |
| a(Å) | 15.48978(8) |
| V(Å³) | 3716.514 |
| Z | 4 |

As set forth above, according to embodiments of the application, there is provided an oxynitride-based phosphor having excellent structural stability, in particular, having excellent luminescent brightness in a red light wavelength band and a novel crystal structure facilitating improvements in luminescent brightness to thereby be appropriately used in LED fields of application, and a light emitting device including the same.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. An oxynitride-based phosphor comprising:
a rare-earth element dissolved in a host material, the host material represented by a general formula:

$Ca_{15}Si_{20}O_{10}N_{30}$, wherein the rare-earth element is at least one selected from a group consisting of manganese (Mn), cerium (Ce), praseodymium (Pr), neodymium (Nd), samarium (Sm), europium (Eu), gadolinium (Gd), dysprosium (Dy), terbium (Tb), holmium (Ho), erbium (Er), thulium (Tm) and ytterbium (Yb), and
the host material has a crystal lattice according to a peak of an X-ray powder diffraction pattern, the crystal lattice having a cubic crystal structure.

2. The oxynitride-based phosphor of claim 1, wherein when the rare-earth element is denoted as Re, the oxynitride-based phosphor is represented by a general formula: $(Ca_{1-x})_{15}Si_{20}O_{10}N_{30}:Re_x$ (0.0001<x<0.2).

3. The oxynitride-based phosphor of claim 1, wherein in the cubic crystal structure of the host material, a lattice constant a=15.48978 Å and a rate of change of the lattice constant a is 10% or less.

4. The oxynitride-based phosphor of claim 1, wherein the rare-earth element is $Eu^{2+}$.

5. The oxynitride-based phosphor of claim 1, wherein a space group of the cubic crystal structure is Pa-3.

6. The oxynitride-based phosphor of claim 1, wherein the oxynitride-based phosphor exhibits a light emitting peak wavelength of 600 to 660 nm with respect to excitation light having a peak wavelength range of 250 to 550 nm.

7. The oxynitride-based phosphor of claim 1, wherein the oxynitride-based phosphor has an average particle size of 1 to 20 μm.

8. A light emitting device, comprising:
a light emitting element configured for emitting excitation light; and
a wavelength converting unit configured for absorbing the excitation light and emitting visible light,
wherein the wavelength converting unit includes:
an oxynitride-based phosphor having a rare-earth element dissolved in a host material represented by a general formula:

$Ca_{15}Si_{20}O_{10}N_{30}$, the rare-earth element being at least one selected from a group consisting of manganese (Mn), cerium (Ce), praseodymium (Pr), neodymium (Nd), samarium (Sm), europium (Eu), gadolinium (Gd), dysprosium (Dy), terbium (Tb), holmium (Ho), erbium (Er), thulium (Tm) and ytterbium (Yb), and
the host material has a crystal lattice according to a peak of an X-ray powder diffraction pattern, the crystal lattice having a cubic crystal structure.

9. The light emitting device of claim 8, wherein the light emitting element is an ultraviolet light emitting diode or blue light emitting diode.

10. The light emitting device of claim 8, wherein when the rare-earth element is denoted as Re, the oxynitride-based phosphor is represented by a general formula: $(Ca_{1-x})_{15}Si_{20}O_{10}N_{30}:Re_x$ (0.0001<x<0.2).

11. The light emitting device of claim 8, wherein in the cubic crystal structure of the host material, a lattice constant a=15.48978 Å and a rate of change of the lattice constant a is 10% or less.

12. The light emitting device of claim 8, wherein the rare-earth element is $Eu^{2+}$.

13. The light emitting device of claim 8, wherein a space group of the cubic crystal structure is Pa-3.

14. The light emitting device of claim 8, wherein the oxynitride-based phosphor exhibits a light emitting peak wavelength of 600 to 660 nm with respect to excitation light having a peak wavelength range of 250 to 550 nm.

15. The light emitting device of claim 8, wherein the oxynitride-based phosphor has an average particle size of 1 to 20 μm.

16. A method for preparing an oxynitride-based phosphor, the method comprising steps of:
mixing a rare-earth oxide with a host material having a general formula: $Ca_{15}Si_{20}O_{10}N_{30}$ to form a mixture; and
firing the mixture under a gas atmosphere at a temperature of about 1400 to 1600° C.,
wherein:
the rare-earth element being at least one selected from a group consisting of manganese (Mn), cerium (Ce), praseodymium (Pr), neodymium (Nd), samarium (Sm), europium (Eu), gadolinium (Gd), dysprosium (Dy), terbium (Tb), holmium (Ho), erbium (Er), thulium (Tm) and ytterbium (Yb), and
the host material having a crystal lattice according to a peak of an X-ray powder diffraction pattern, the crystal lattice having a cubic crystal structure.

17. The method according to claim 16, further comprising the step of:
crushing the fired mixture to form the oxynitride-based phosphor.

18. The method according to claim 16, wherein the gas atmosphere is a nitrogen gas atmosphere optionally containing hydrogen.

19. The method according to claim 16, wherein the firing step is performed within a range of 30 minutes to 100 hours.

20. The method according to claim 16, wherein when the rare-earth element is denoted as Re, the oxynitride-based phosphor is represented by a general formula: $(Ca_{1-x})_{15}Si_{20}O_{10}N_{30}:Re_x$ (0.0001<x<0.2).

* * * * *